US 12,426,453 B2

(12) United States Patent
Yang

(10) Patent No.: US 12,426,453 B2
(45) Date of Patent: Sep. 23, 2025

(54) DOUBLE-SIDED DISPLAY PANEL AND DISPLAY DEVICE

(71) Applicant: TCL CHINA STAR OPTOELECTRONICS TECHNOLOGY CO., LTD., Shenzhen (CN)

(72) Inventor: Hong Yang, Shenzhen (CN)

( * ) Notice: Subject to any disclaimer, the term of this patent is extended or adjusted under 35 U.S.C. 154(b) by 86 days.

(21) Appl. No.: 17/435,715

(22) PCT Filed: Jul. 23, 2021

(86) PCT No.: PCT/CN2021/108157
§ 371 (c)(1),
(2) Date: Jan. 19, 2023

(87) PCT Pub. No.: WO2023/283996
PCT Pub. Date: Jan. 19, 2023

(65) Prior Publication Data
US 2024/0016009 A1    Jan. 11, 2024

(30) Foreign Application Priority Data
Jul. 15, 2021    (CN) .......................... 202110799700.1

(51) Int. Cl.
*H10K 59/128*    (2023.01)
*H10K 59/131*    (2023.01)

(52) U.S. Cl.
CPC ......... *H10K 59/128* (2023.02); *H10K 59/131* (2023.02)

(58) Field of Classification Search
CPC .. H10K 59/127; H10K 59/176; G09G 3/3266; G09G 3/3233
See application file for complete search history.

(56) References Cited

U.S. PATENT DOCUMENTS 7,679,283 B2 *   3/2010   Nimura ................ H10K 59/128
                                                        313/506
7,773,056 B2 *   8/2010   Kwak .................. G09G 3/3233
                                                         345/82

(Continued)

FOREIGN PATENT DOCUMENTS

CN        102930787 A    2/2013
CN        105226068 A    1/2016

(Continued)

OTHER PUBLICATIONS

International Search Report in International application No. PCT/CN2021/108157, mailed on Mar. 30, 2022.

(Continued)

*Primary Examiner* — Kevin M Nguyen

(57) ABSTRACT

A double-sided display panel and a display device are disclosed. The double-sided display panel includes pixel units defined by scan lines and data lines intersected. The pixel unit includes a first light emitting unit, a second light emitting unit, and a pixel circuit. A first light emitting unit of an $i^{th}$ one of the pixel units counted from left to right and a second light emitting unit of an $i^{th}$ one of the pixel units counted from right to left in each row are electrically connected to the same pixel circuit to achieve the same obverse images displayed on two sides of the double-sided display panel.

14 Claims, 9 Drawing Sheets

(56) References Cited

U.S. PATENT DOCUMENTS

| | | | | |
|---|---|---|---|---|
| 2007/0132379 A1* | 6/2007 | Huang | ............... | H10K 59/128 |
| | | | | 313/506 |
| 2016/0012779 A1* | 1/2016 | Gu | ............... | G09G 3/3233 |
| | | | | 345/215 |
| 2019/0157371 A1* | 5/2019 | Yi | ............... | G09G 3/3225 |
| 2021/0408440 A1* | 12/2021 | Yuan | ............... | H10K 50/824 |
| 2022/0157915 A1* | 5/2022 | Lee | ............... | G09G 3/3233 |

FOREIGN PATENT DOCUMENTS

| | | | |
|---|---|---|---|
| CN | 105301813 A | 2/2016 | |
| CN | 106783913 A | 5/2017 | |
| CN | 108364990 A | 8/2018 | |
| CN | 111584578 A | 8/2020 | |
| CN | 112150970 A | 12/2020 | |
| CN | 112786668 A | 5/2021 | |
| JP | 2004152612 A | 5/2004 | |
| KR | 20080089793 A | 10/2008 | |

OTHER PUBLICATIONS

Written Opinion of the International Search Authority in International application No. PCT/CN2021/108157, mailed on Mar. 30, 2022.

Chinese Office Action issued in corresponding Chinese Patent Application No. 202110799700.1 dated May 17, 2023, pp. 1-6.

\* cited by examiner

DOUBLE-SIDED DISPLAY PANEL AND DISPLAY DEVICE

FIELD OF INVENTION

The present invention relates to a field of display technologies, especially to a double-sided display panel and a display device.

BACKGROUND OF INVENTION

Generally, a double-sided display device allows a viewer to view displayed images from two opposite sides of the double-sided display device. Therefore, double-sided displays have become mainstream displays of billboards and labels in trading markets of banks and supermarket. For example, an intersection warning screen equipped with a double-sided display device can enable two-way driving vehicles to obtain synchronized information. Furthermore, a double-sided display device can also enable customers in different entrances in a mall to clearly see images of product introduction. Moreover, a display screen equipped with a double-sided display device can also be applied to various scenes of broadcasting information at same time in adjacent spaces.

The double-sided display device generally encapsulates two organic light emitting diode (OLED) display panels together in mechanical connection, or bonds two encapsulated OLED display panels together, which would increase a thickness of the double-sided display device. Therefore, to make the double-sided display device light and compact, a double-sided display device in which thin film transistors for controlling front side display and rear side display are made in the same lamination layer, or a double-sided display device in which thin film transistors are commonly used for front side display and rear side display, has been generated. However, making the thin film transistors in the same lamination layer lowers a number of pixels of the display device by at least half, and a design of commonly used thin film transistors of the double-sided display usually omits that only images on one of the two sides of the double-sided display device is correct to viewers. In other words, images displayed on the two sides of the double-sided display device are mirror images.

Therefore, a structure of the conventional double-sided display device urgently requires improvement.

SUMMARY OF INVENTION

Technical Issue the embodiment of the present invention provides a double-sided display panel and a display device to solve a technical issue that images displayed on two sides of the conventional double-sided display panel are mirror images.

Technical Solution

To solve the above issue, technical solutions provided by the present invention are as follows:

The embodiment of the present invention provides a double-sided display panel, comprising: a plurality of data lines arranged along a first direction;

and a plurality of scan lines arranged along a second direction intersecting the first direction, wherein the scan lines intersect the data lines to define a plurality of pixel regions, a pixel unit is disposed in each of the pixel regions, and the pixel unit comprises a first light emitting unit and a second light emitting unit in opposite light emitting directions and a pixel circuit; wherein the first direction is a row direction, the second direction is a column direction, and the first light emitting unit of an $i^{th}$ one of the pixel units counted from left to right in each row and the second light emitting unit of an $i^{th}$ one of the pixel units counted from right to left in the row are electrically connected to the pixel circuit of an $i^{th}$ one of the pixel units counted from right to left in the row, and i is a positive integer; wherein each of the pixel circuits comprises a driving transistor and a switch transistor, gate electrodes of the switch transistors of the pixel circuits in the same row are electrically connected to one of the scan lines corresponding to the row, and source electrodes or drain electrodes of the switch transistors of the pixel circuits in the same column are electrically connected to one of the data lines corresponding to the column; wherein first anodes of the first light emitting units of an $i^{th}$ one of the pixel units counted from left to right in each row and second anodes of the second light emitting units of an $i^{th}$ one of the pixel units counted from right to left in the row are electrically connected to source electrodes or drain electrodes of the driving transistors.

In at least one embodiment of the present invention, the double-sided display panel comprises a plurality of first wires, the first anode and the second anode electrically connected to the same driving transistor are electrically connected through one of the first wires, and the first anode or the second anode is electrically connected to the source electrode or the drain electrode of a corresponding one of the driving transistors through a via hole.

In at least one embodiment of the present invention, the first wires and the source electrodes and the drain electrodes in the pixel circuits are disposed in the same layer.

In at least one embodiment of the present invention, the second direction is the column direction, any one of the wires is electrically connected to the first light emitting units of an $i^{th}$ column counted from left to right and is electrically connected to the second light emitting units of an $i^{th}$ column counted from right to left.

In at least one embodiment of the present invention, in the pixel units, the first light emitting units and the second light emitting units are arranged alternately in at least one of the first direction and the second direction.

In at least one embodiment of the present invention, the second light emitting unit is disposed on a side of the first light emitting unit near or away from an underlay of the double-sided display panel.

In at least one embodiment of the present invention, first cathodes of the first light emitting units and the source electrodes and the drain electrodes of the pixel circuits are disposed in the same layer.

In at least one embodiment of the present invention, the double-sided display panel comprises:
- a passivation layer disposed on the source electrodes, the drain electrodes, the first wires, and the first cathodes;
- a first pixel definition layer disposed on the passivation layer;
- a first anode disposed on the first pixel definition layer;
- a planarization layer disposed on the first anode;
- the second anode disposed on the planarization layer;
  wherein the first pixel definition layer has a plurality of first through holes defined through the first pixel definition layer, the passivation layer, the planarization layer has a plurality of second through holes defined through the planarization layer, the first pixel definition layer, and the passivation layer, in the first light emitting unit and the second light emitting unit electrically connected to the same pixel circuit, the first anode of the first light emitting unit is electrically connected to one of the first wires through a corresponding one of the first through holes, and the second anode of the second light emitting unit is electrically connected to the first wire through a corresponding one of the second through holes.

The embodiment of the present invention provides a double-sided display panel comprising a plurality of data lines arranged along a first direction; and a plurality of scan lines arranged along a second direction intersecting the first direction, wherein the scan lines intersect the data lines to define a plurality of pixel regions, a pixel unit is disposed in each of the pixel regions, and the pixel unit comprises a first light emitting unit and a second light emitting unit in opposite light emitting directions and a pixel circuit; wherein the first direction is a row direction, and the first light emitting unit of an $i^{th}$ one of the pixel units counted from left to right in each row and the second light emitting unit of an $i^{th}$ one of the pixel units counted from right to left in the row are electrically connected to the pixel circuit of an $i^{th}$ one of the pixel units counted from right to left in the row, and i is a positive integer.

In at least one embodiment of the present invention, each of the pixel circuits comprises a driving transistor, and first anodes of the first light emitting units of an $i^{th}$ one of the pixel units counted from left to right in each row and second anodes of the second light emitting units of an $i^{th}$ one of the pixel units counted from right to left in the row are electrically connected to a source electrode or a drain electrode of the driving transistor.

In at least one embodiment of the present invention, the double-sided display panel comprises a plurality of first wires, the first anode and the second anode electrically connected to the same driving transistor are electrically connected through one of the first wires, and the first anode or the second anode is electrically connected to the source electrode or the drain electrode of a corresponding one of the driving transistors through a via hole.

In at least one embodiment of the present invention, the first wires and the source electrodes and the drain electrodes in the pixel circuits are disposed in the same layer.

In at least one embodiment of the present invention, the second direction is the column direction, any one of the wires is electrically connected to the first light emitting units of an $i^{th}$ column counted from left to right and is electrically connected to the second light emitting units of an $i^{th}$ column counted from right to left.

In at least one embodiment of the present invention, in the pixel units, the first light emitting units and the second light emitting units are arranged alternately in at least one of the first direction and the second direction.

In at least one embodiment of the present invention, the second light emitting unit is disposed on a side of the first light emitting unit near or away from an underlay of the double-sided display panel.

In at least one embodiment of the present invention, first cathodes of the first light emitting units and the source electrodes and the drain electrodes of the pixel circuits are disposed in the same layer.

In at least one embodiment of the present invention, the double-sided display panel comprises:

a passivation layer disposed on the source electrodes, the drain electrodes, the first wires, and the first cathodes;
a first pixel definition layer disposed on the passivation layer;
a first anode disposed on the first pixel definition layer;
a planarization layer disposed on the first anode;
the second anode disposed on the planarization layer;
wherein the first pixel definition layer has a plurality of first through holes defined through the first pixel definition layer, the passivation layer, the planarization layer has a plurality of second through holes defined through the planarization layer, the first pixel definition layer, and the passivation layer, in the first light emitting unit and the second light emitting unit electrically connected to the same pixel circuit, the first anode of the first light emitting unit is electrically connected to one of the first wires through a corresponding one of the first through holes, and the second anode of the second light emitting unit is electrically connected to the first wire through a corresponding one of the second through holes.

In at least one embodiment of the present invention, in a thickness direction of the double-sided display panel, the second light emitting unit and the first light emitting unit of each of the pixel units have an overlapping surface.

In at least one embodiment of the present invention, a first light shielding layer is disposed between the second light emitting unit and the first light emitting unit.

The embodiment of the present invention further provides a display device comprising a double-sided display panel, and the double-sided display panel comprises a plurality of data lines arranged along a first direction; and a plurality of scan lines arranged along a second direction intersecting the first direction, wherein the scan lines intersect the data lines to define a plurality of pixel regions, a pixel unit is disposed in each of the pixel regions, and the pixel unit comprises a first light emitting unit and a second light emitting unit in opposite light emitting directions and a pixel circuit; wherein the first direction is a row direction, and the first light emitting unit of an $i^{th}$ one of the pixel units counted from left to right in each row and the second light emitting unit of an $i^{th}$ one of the pixel units counted from right to left in the row are electrically connected to the pixel circuit of an $i^{th}$ one of the pixel units counted from right to left in the row, and i is a positive integer.

Advantages

The embodiment of the present invention provides a double-sided display panel and a display device that control positive and negative pixels in in relative mirror locations to simultaneously emit light by electrically connecting a first light emitting unit and a second light emitting unit with opposite light emitting directions in relative mirror locations to the same pixel circuit such that a double-sided display panel showing two correct obverse images on two sides is achieved and a viewer's viewing experience is improved.

INDICATION OF REFERENCE CHARACTERS

Figure 1:
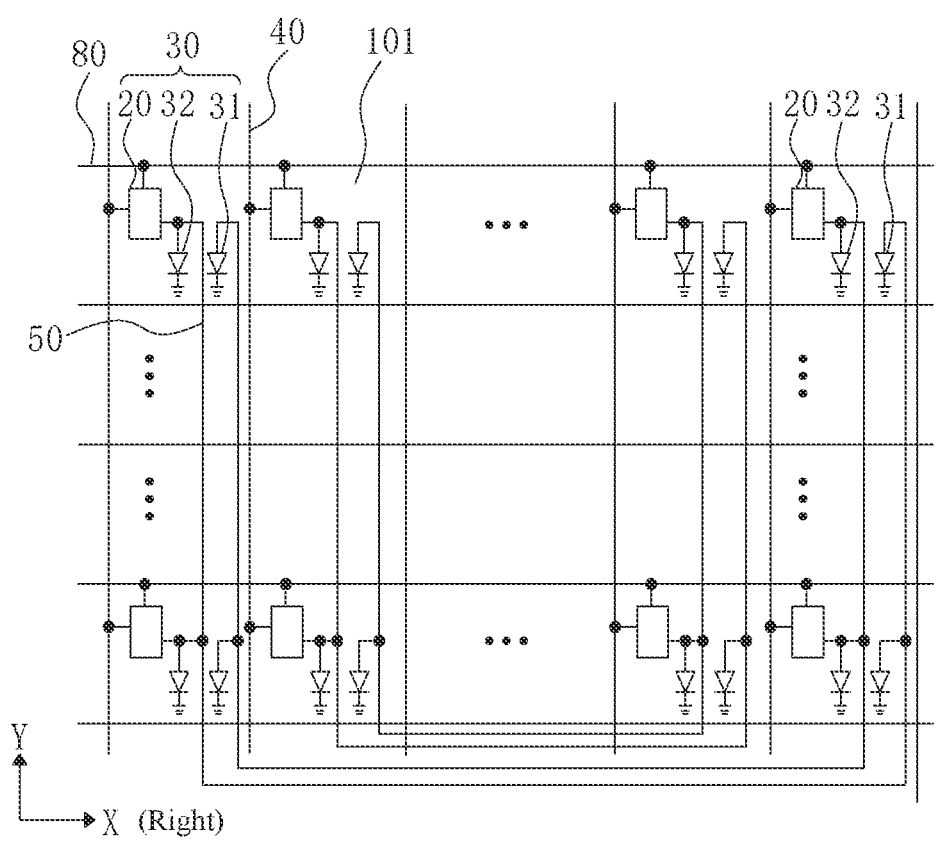
FIG. 1 is a schematic plan view of a double-sided display panel provided by the embodiment of the present invention.

| Reference character | Element name | Reference character | Element name |
|---|---|---|---|
| 100 | double-sided display panel | 10 | underlay |
| 20 | pixel circuit | 30 | pixel unit |
| 40 | data lines | 50 | first wires |
| 60 | second light shielding layer | 21 | active layer |
| 22 | gate electrode | 23 | source electrode |
| 24 | drain electrode | 31 | first light emitting unit |
| 32 | second light emitting unit | 311 | first anode |
| 312 | first light emitting layer | 313 | first cathode |
| 321 | second anode | 322 | second light emitting layer |
| 323 | second cathode | 71 | buffer layer |
| 72 | gate electrode insulation layer | 73 | interlayer dielectric layer |
| 74 | passivation layer | 75 | first pixel definition layer |
| 76 | planarization layer | 77 | second pixel definition layer |
| 80 | scan lines | | |

DETAILED DESCRIPTION OF PREFERRED EMBODIMENTS

The present application provides a double-sided display panel and a display device. To make the objective, the technical solution, and the effect of the present application clearer and more explicit, the present application will be further described in detail below with reference to the accompanying drawings. It should be understood that the specific embodiments described here are only used to explain the present application instead of being used to limit the present application.

The present invention aims at a technical issue that a conventional double-sided display panel displays mirror images on two sides and only allow a viewer on one side to see obverse images, and provides the present embodiment to overcome the defects.

Figure 2:
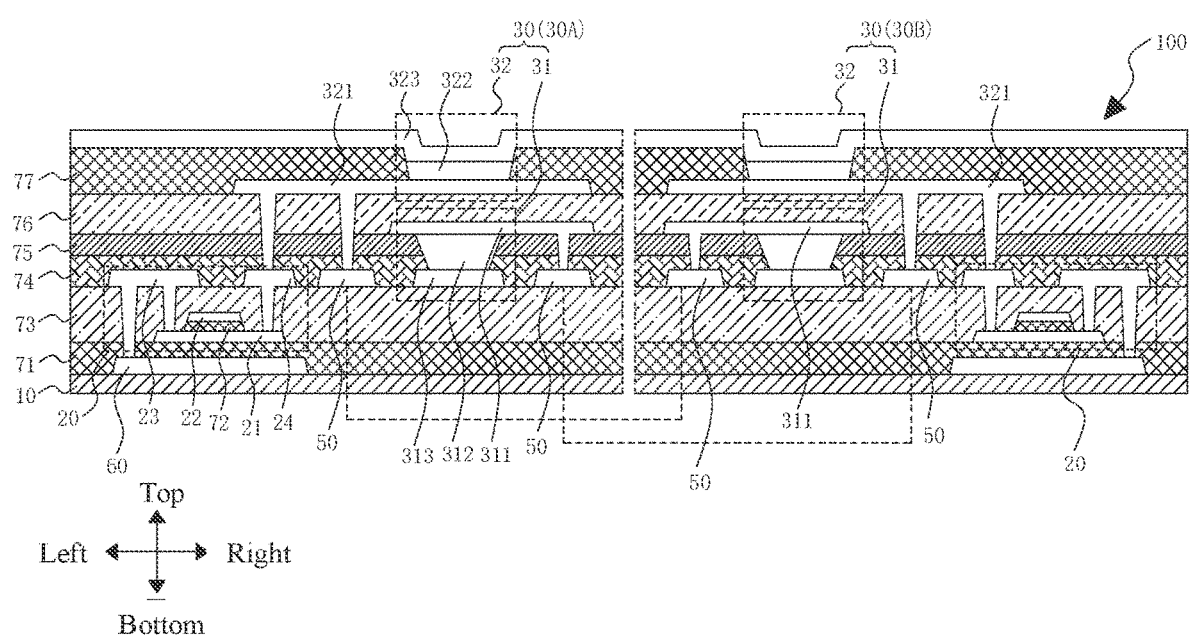
FIG. 2 is a schematic cross sectional structural view of an $i^{th}$ one of the pixel units counted from left to right and an $i^{th}$ one in the pixel units counted from right to left in the same row of the double-sided display panel provided by the embodiment of the present invention.

With reference to FIGS. 1 and 2, FIG. 1 is a schematic plan view of a double-sided display panel provided by the embodiment of the present invention, and FIG. 2 is a schematic cross sectional structural view of an i$^{th}$ one of the pixel units counted from left to right and an i$^{th}$ one in the pixel units counted from right to left in the same row of the double-sided display panel provided by the embodiment of the present invention. The embodiment of the present invention provides a double-sided display panel 100 comprising a plurality of data lines 40 arranged along a first direction X and a plurality of scan lines 80 arranged along a second direction Y. The first direction X intersects the second direction Y, the scan lines 80 intersects the data lines 40 to define a plurality of pixel regions 101. A pixel unit 30 is disposed in each of the pixel regions. The pixel unit 30 comprises a first light emitting unit 31 and a second light emitting unit 32 in opposite light emitting directions and a pixel circuit 20. The first light emitting unit 31 is one of a bottom light emitting unit and a top light emitting unit, and the second light emitting unit 32 is the other of the bottom light emitting unit and the top light emitting unit. The pixel circuit 20 is configured to drive light emitting unit to emit light.

In the embodiment of the present application, the first direction X is a row direction, the second direction Y is a column direction, the first light emitting unit 31 of an i$^{th}$ one of the pixel units counted from left to right in each row 30 and the second light emitting unit 32 of an i$^{th}$ one of the pixel units 30 counted from right to left in the row are electrically connected to the pixel circuit 20 of an i$^{th}$ one of the pixel units 30 in the row, and i is a positive integer. Namely, any one of the pixel circuits 20 drives one first light emitting unit 31 and one second light emitting unit 32 with the first light emitting unit 31 in relative mirror locations in the pixel region 101 in which the pixel circuit 20 is located to achieve the same obverse images displayed by font and rear surfaces of the double-sided display panel 100.

The light emitting units described by the embodiment of the present invention can be light emitting units of a minimal unit, each light emitting unit corresponds to a sub-pixel, and can emit any one of red light, green light, and blue light.

In the present embodiment, taking a direction shown in FIG. 2 as an example, the first light emitting units 31 emit light downward and the second light emitting units 32 emit light downward to achieve double-sided light emission of the double-sided display panel 100.

In the embodiment of the present application, the pixel circuit 20 comprises a driving transistor and a switch transistor, gate electrodes of the switch transistors of the pixel circuits 20 in the same row are electrically connected to one of the scan lines corresponding to the row 80, and the pixel circuits source electrodes or drain electrodes of the switch transistors in the same column are electrically connected to one of the data lines corresponding to the column 40.

With reference to FIGS. 1 and 2, the first light emitting unit 31 comprises a first anode 311, and the second light emitting unit 32 comprises a second anode 321. The first anode 311 of the first light emitting unit 31 of an i$^{th}$ one of the pixel units 30A counted from left to right in each row and the second anode 321 of the second light emitting unit 32 of an i$^{th}$ one of the pixel units 30B counted from right to left in the row are simultaneously electrically connected to a source electrode 23 or a drain electrode 24 of the driving transistor in the pixel unit 30A.

Furthermore, the double-sided display panel 100 comprises a plurality of first wires 50. The first anode 311 and the second anode 321 electrically connected to the same driving transistor are electrically connected to each other through the first wires 50. The first anode 311 or the second anode 321 is electrically connected to the source electrode 23 or the drain electrode 24 of the driving transistor through a via hole. In the embodiment of the present application, as shown in FIG. 2, the first light emitting unit 31 can be a bottom light emitting unit. The second light emitting unit 32 is a top light emitting unit. The second anode 321 of the second light emitting unit 32 of the pixel unit 30A is electrically connected to the drain electrode 24 of the driving transistor through a via hole. The first anode 311 of the first light emitting unit 31 of the pixel unit 30B is connected to the second anode 321 of the second light emitting unit 32 of the pixel unit 30A through the first wire 50 to achieve that the first light emitting unit 31 and the second light emitting unit 32 in mirror locations are electrically connected to the same pixel circuit 20 to be driven by the same pixel circuit 20 to emit light of the same color.

With reference to FIG. 1, In the embodiment of the present application, any one of the scan lines 80 is electrically connected to a plurality of the pixel circuits 20 of a corresponding row. Any one of the data lines 40 is electrically connected to the pixel circuits 20 of a corresponding column. While being electrically connected to the first light emitting unit 31 of the pixel unit 30A (the same row from left to right an $i^{th}$ one of the pixel units) and the second light emitting unit 32 of the pixel unit 30B (the same row counted from right to left an $i^{th}$ one of the pixel units), the first wires 50 is also electrically connected to the light emitting units of a row in which the first light emitting unit 31 and the second light emitting unit 32 are located. Namely, any one of the first wires 50 is electrically connected to the first light emitting units of an $i^{th}$ column counted from left to right 31 and is electrically connected to the second light emitting units of an $i^{th}$ column counted from right to left 32. Electrically connecting the first light emitting units 31 and the second light emitting units 32 of the two columns through the same first wires 50 can simplify a wire design while achieving sequential scan of the pixel units and simultaneous light emission of the first light emitting units 31 and the second light emitting units 32 in relative mirror locations.

With reference to FIG. 2, in the embodiment of the present application, the first wires 50 and the source electrode and the drain electrode in the pixel circuit 20 can be disposed in the same layer, and can be manufactured with the source electrode and the drain electrode by the same patterning process to save a photomask process. A thickness of the first wires should not be lower than 4000 Å, and a resistivity of material thereof should be be greater than 2.83*10−8Ω·m.

In an embodiment, the first wires 50 can be a design of U-shape, a bottom end of the U-shape can be in a non-display region of the double-sided display panel 100.

With reference to FIG. 1, when the data lines 40 and the first wires 50 are disposed in the same layer, to avoid the data lines 40 interfering with the first wires 50, portions of the first wires 50 in the display region can be designed to be parallel to the data lines 40.

When the data lines 40 and the first wires 50 are disposed in different layers, portions of the data lines 40 and the first wires 50 in the display region overlap with each other along a thickness direction to avoid the first wires effecting aperture rate.

Figure 4:
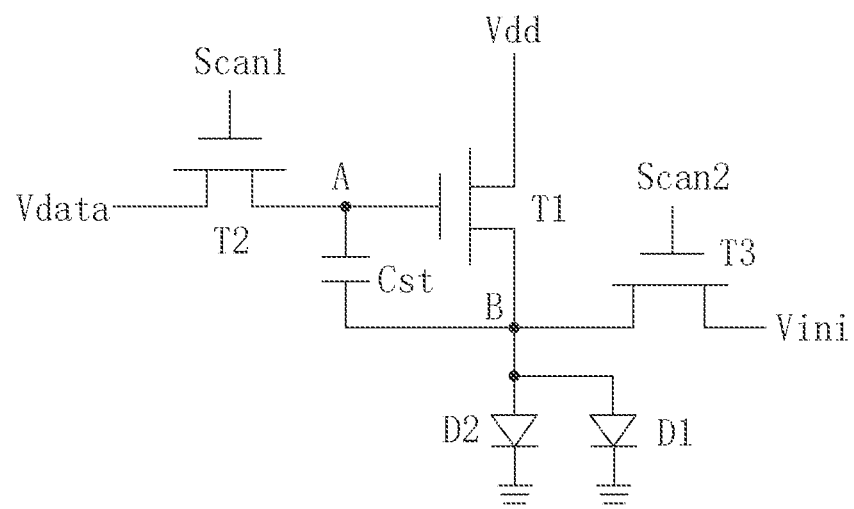
FIG. 4 is a schematic view of a pixel circuit of the double-sided display panel provided by the embodiment of the present invention.

With reference to FIGS. 2 and 4, FIG. 4 is a principle view of the pixel circuit provided by the embodiment of the present invention. Each of the pixel circuits 20 comprises a driving transistor T1, and the driving transistor T1 comprises an active layer 21, a gate electrode 22, a source electrode 23, and a drain electrode 24.

The active layer 21 is disposed on the underlay 10, a gate electrode insulation layer 72 is disposed on the underlay 10, the gate electrode 22 is disposed on the gate electrode insulation layer 72, an interlayer dielectric layer 73 covers the gate electrode 22, a source electrode 23 and a drain electrode 24 are disposed on the interlayer dielectric layer 73. A plurality of first via holes are defined in the interlayer dielectric layer. The source electrode 23 and the drain electrode 24 are connected to the active layer 21 through corresponding ones of the first via holes respectively.

The light emitting unit of the pixel unit 30 can comprise but is not limited to one of micro light emitting diode (LED), mini LED, quantum dot LED (QLED), and organic LED (OLED). In the present embodiment, the light emitting unit is an OLED but is not limited thereto.

The first light emitting unit 31 comprises a first anode 311, a first light emitting layer 312, and a first cathode 313. The second light emitting unit 32 comprises a second anode 321, a second light emitting layer 322, and a second cathode 323. In an embodiment, both the first light emitting layer 312 and the second light emitting layer 322 can comprise a hole injection layer, a hole transport layer, a light emitting material layer, an electron transport layer, and an electron injection layer.

The first anode 311 of the first light emitting unit 31 and the second anode 321 of the second light emitting unit 32 connected to the same the pixel circuit 20 are simultaneously connected to the source electrode 23 or the drain electrode 24 of the driving transistor T1.

Specifically, one of the source electrode 23 and the drain electrode 24 of the driving transistor of the pixel circuit 20 is directly connected to the first anode 311 of the first light emitting unit 31 connected to the pixel circuit 20, or one of the source electrode 23 and the drain electrode 24 of the driving transistor of the pixel circuit 20 is directly connected to the second anode 321 connected to the second light emitting unit 32 of the pixel circuit 20.

In the present embodiment, the source electrode 23 or the drain electrode 24 of the driving transistor T1 of the pixel circuit 20 is directly connected to the second anode 321 connected to the second light emitting unit 32 of the pixel circuit 20. For example, the drain electrode 24 of one driving transistor is electrically connected to the second anode 321 of the second light emitting unit 32 of the pixel unit 30A, and the drain electrode 24 of another driving transistor is electrically connected to the second anode 321 of the second light emitting unit 32 of the pixel unit 30B.

Figure 3:
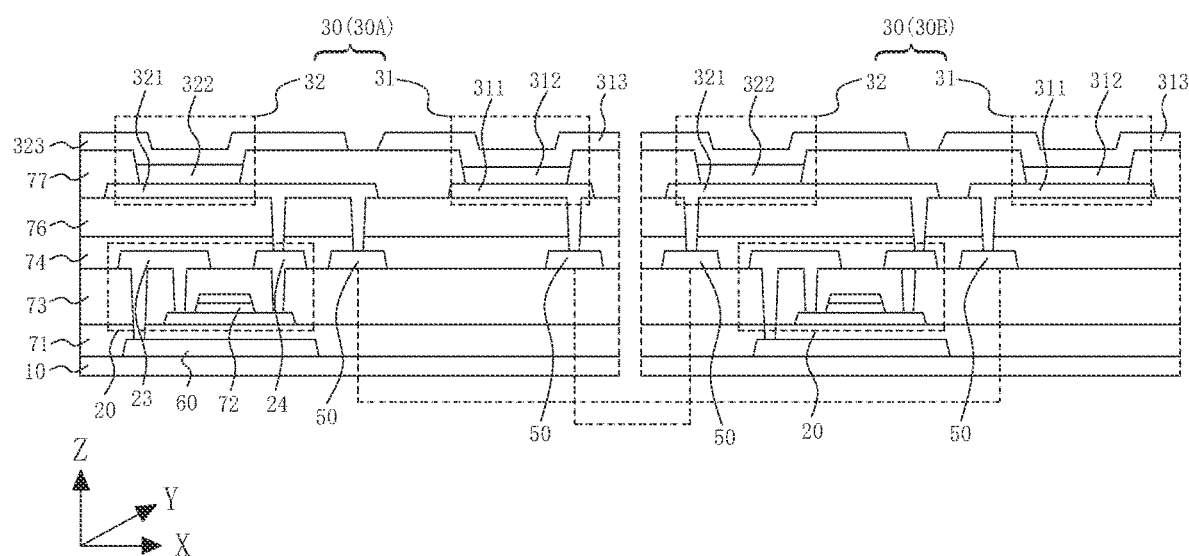
FIG. 3 is schematic structural view of an i$^{th}$ one of the pixel units counted from left to right and an i$^{th}$ one of the pixel units counted from right to left in the same row in the double-sided display panel provided by other embodiment of the present invention.

With reference to FIGS. 2 and 3, the second light emitting unit 32 and the first light emitting unit 31 of the double-sided display panel 100 of the embodiment of the present invention can be stacked, and can be disposed flatly, FIG. 3 illustrates an embodiment of the second light emitting unit 32 and the first light emitting unit 31 disposed flatly. FIG. 2 illustrates an embodiment of the second light emitting unit 32 and the first light emitting unit stacked.

In the embodiment of the present invention, with reference to FIG. 2, the first light emitting unit 31 is a bottom light emitting unit, the second light emitting unit 32 is a top light emitting unit, and the second light emitting unit 32 is disposed on a side of the first light emitting unit 31 away from the underlay 1. In other embodiment, the first light emitting unit can be a top light emitting unit, the second light emitting unit is a bottom light emitting unit, the second light emitting unit is disposed on a side of the first light emitting unit near the underlay 10. Namely, the second light emitting unit 32 and the first light emitting unit 31 are stacked, which can save a region area occupied by the pixel unit 30 and under the same dimension, more pixel units can be disposed to improve a resolution of the double-sided display panel 100.

In an embodiment, with reference to FIG. 2, along a thickness direction Z of the underlay 10, in each of the pixel units 30, the second light emitting unit 32 and the first light emitting unit 31 have an overlapping surface.

Preferably, the second light emitting layer 322 of the second light emitting unit 32 and the first light emitting layer 312 of the first light emitting unit 31 overlap with each other along the thickness direction Z.

In an embodiment, as shown in FIG. 2, the first cathode 313 and the source electrode 23, the drain electrode 24 can be disposed in the same layer, which can reduce an entire thickness of the double-sided display panel.

Specifically, with reference to FIG. 2, a passivation layer 74 is disposed on the first cathode 313, a first pixel definition layer 75 is disposed on the passivation layer 74, the first pixel definition layer 75 comprises a plurality of first recesses, the first light emitting layer 312 is disposed in the first recesses, and the first anode 311 is disposed on the first light emitting layer 312. The first cathode 313 is a transmissive cathode, the first anode 311 is a reflective anode. In other embodiment, locations of the first cathode 313 and the first anode 311 are interchangeable. However, in the present embodiment, the first cathode is a reflective cathode, and the first anode is a transmissive anode.

A planarization layer 76 is disposed on the first anode 311, a second anode 321 is disposed on the planarization layer 76, a second via hole is defined in the planarization layer 76, the second via hole sequentially extends through the planarization layer 76, the first pixel definition layer 75, and the passivation layer 74. The second anode 321 is electrically connected to the drain electrode 24 through the second via hole. A second pixel definition layer 77 is disposed on the second anode 321, the second pixel definition layer 77 comprises a plurality of second recesses, the second light emitting layer 322 is located in the second recesses, and the second cathode 323 are disposed on the second light emitting layer 322.

The first light shielding layer is disposed between the second light emitting unit 32 and the first light emitting unit 31 to make images displayed on the front and rear surfaces not interfere with each other.

In an embodiment, with reference to FIG. 2, the first light shielding layer can be a planarization layer 76, the planarization layer 76 can use opaque organic photoresist material such that the planarization layer 76 can perform a light shielding effect while providing a plan base to save a light shielding layer.

In other embodiment, the first light shielding layer can be disposed between the planarization layer 76 and the first anode 311, and the first light shielding layer can be a black matrix. In the present embodiment, the double-sided display panel 100 comprises a plurality of first wires 50 electrically connected to the first light emitting unit 31 and the second light emitting unit 32 of the same the pixel circuit 20. The first anode 311 of the first light emitting unit 31 is electrically connected to the second anode 321 of the second light emitting unit 32 through the first wire 50, the first anode 311 or the second anode 321 is electrically connected to the source electrode or the drain electrode of the driving transistor T1 through a via hole. namely, the first anode 311 of the first light emitting unit 31 of an $i^{th}$ one of the pixel units 30A counted from left to right in each row is electrically connected to the second anode 321 of the second light emitting unit 32 of an $i^{th}$ one of the pixel units 30B counted from right to left in the row through the first wire 50 to achieve a parallel connection between the second light emitting unit 32 and the first light emitting unit 31 in relative mirror locations to parallelly control the second light emitting unit 32 and the first light emitting unit 31 in relative mirror locations.

Figure 5:
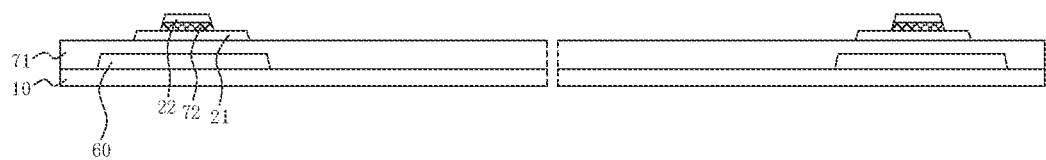
FIGS. 5 to 13 are schematic structural views of manufacturing processes of the double-sided display panel provided by the embodiment of the present invention.

In some embodiments of the present invention, with reference to FIGS. 2 and 5, the passivation layer 74 is disposed on the source electrode 23, the drain electrode 24, the first wires 50, and the first cathode 313, the first pixel definition layer 75 is disposed on the passivation layer 74, the first anode 311 is disposed on the first pixel definition layer 75, and the planarization layer 76 is disposed on the first anode 311. A plurality of first through holes are defined in the first pixel definition layer 75 and extend through the first pixel definition layer 75 and the passivation layer 74. A plurality of second through holes are defined in the planarization layer 76 and extend through the planarization layer 76, the first pixel definition layer 75, and the passivation layer 74 and are electrically connected to the first light emitting unit 31 and the second light emitting unit 32 of the same the pixel circuit. The first anode 311 of the first light emitting unit 31 are connected to the first wire 50 through a corresponding one of the first through holes. The second anode 321 of the second light emitting unit 32 is connected to the first wire 50 through a corresponding one of the second through holes.

In other embodiment, the first wires 50 and the gate electrode 22 on the underlay 10 can be disposed in the same layer. however, to guarantee that the first wires 50 can connect with the first anode 311 of the first light emitting unit 31 of an $i^{th}$ one of the pixel units 30A counted from left to right in each row and the second anode 321 of the second light emitting unit 32 of an $i^{th}$ one of the pixel units 30B counted from right to left in the row, via holes defined correspondingly above the first anode 311 and the second anode 321 of the first wires 50 are necessary to make the first anode 311 and the second anode 321 to connect with the same first wire 50 through corresponding ones of the via holes.

In an embodiment, the double-sided display panel 100 further comprises a second light shielding layer 60, and the second light shielding layer is disposed between the active layer 21 and the underlay 10 and is configured to shield ambient light to prevent the ambient light from irradiating the active layer 21 to further prevent the ambient light from influencing electrical characteristics of the active layer 21.

A buffer layer 71 is disposed between the second light shielding layer 60 and the active layer 21. The second light shielding layer 60 can be manufactured by metal material.

In other embodiment, the first wires 50 and the second light shielding layer 60 can be disposed in the same layer.

In other embodiment, with reference to FIG. 3, the second light emitting unit 32 and the first light emitting unit 31 disposed flatly, the second light emitting unit 32 and the first light emitting unit 31 have no overlapping surface.

Specifically, in the a plurality of pixel unit 30, the first light emitting units 31 and the second light emitting units 32 are arranged alternately along at least one of the horizontal direction X and the vertical direction Y. In the present embodiment, the first light emitting unit 31 and the second light emitting unit are arranged alternately along the horizontal direction X, as shown in FIGS. 1 and 3.

A stacked structure of film layers of the pixel circuit 20 is the same as that as shown in FIG. 2, which can refer to descriptions of the above embodiment, and it is not described repeatedly here.

It is different from the embodiment as shown in FIG. 2 that the second light emitting layer 322 of the second light emitting unit 32 and the first light emitting layer 312 of the first light emitting unit 31 in the same the pixel unit 30 have no overlapping surface along the thickness direction Z.

The second light emitting layer 322 of the second light emitting unit 32 and the first light emitting layer 312 of the first light emitting unit 31 can be disposed in the recesses of the same pixel definition layer, and can reduce a process for a pixel definition layer to further decrease an entire film thickness of the double-sided display panel 100.

Specifically, with reference to FIG. 3, the planarization layer 76 is disposed on the passivation layer 74. The first anode 311 and the second anode 321 can be disposed in the same layer. The first anode 311 and the second anode 321 are disposed on the planarization layer 76. The second light emitting layer 322 is disposed on the second anode 321, the first light emitting layer 312 is disposed on the first anode 311, the second pixel definition layer 77 is disposed on the first anode 311 and the second anode 321. The second pixel definition layer 77 comprises a plurality of recesses, the second light emitting layer 322 and the first light emitting layer 312 are located in corresponding ones of the recesses respectively. The first cathode 313 is disposed on the first light emitting layer 312. The second cathode 323 is disposed on the second light emitting layer 322.

In the first light emitting unit 31 and the second light emitting unit 32 electrically connected to the same the pixel circuit 20, the first anode 311 of the first light emitting unit 31 is connected to the second anode 321 of the second light emitting unit 32 through the first wire 50.

Specifically, the first wire 50, the source electrode 23, and the drain electrode 24 are disposed in the same layer. In the first light emitting unit 31 and the second light emitting unit 32 electrically connected to the same the pixel circuit 20, a via hole is defined in a portion of the planarization layer 76 corresponding to the first anode 311 of the first light emitting unit 31. The via hole sequentially extends through the planarization layer 76 and the passivation layer 74 to expose at least partial surface of one first wire 50 such that the first anode 311 can be electrically connected to the first wires 50 the via hole. Accordingly, a via hole is defined in a portion of the planarization layer 76 corresponding to the second anode 321 of the second light emitting unit 32. The via hole sequentially extends through the planarization layer 76 and the passivation layer 74 to expose another partial surface of the first wire 50 such that the second anode 321 can be connected to the first wire 50 through the via hole.

With reference to FIG. 4, the pixel circuit 20 of the embodiment of the present invention can be a 7T1C framework, 5T1C framework, 3T1C framework, etc., which is not limited here. Taking the 3T1C framework as an example, the pixel circuit 20 comprises a first transistor T1, a second transistor T2, a third transistor T3, and a storage capacitor Cst. A gate electrode of the first transistor T1 is electrically connected to a first node A, a source electrode of the first transistor T1 is electrically connected to a power voltage Vdd, and a drain electrode of the first transistor T1 is electrically connected to a second node B. A gate electrode of the second transistor T2 is electrically connected to a first scan signal Scan1, a source electrode of the second transistor T2 is electrically connected to a data signal voltage Vdata, and a drain electrode of the second transistor T2 is electrically connected to the first node A. A gate electrode of the third transistor T3 is electrically connected to a second scan signal Scan2, a source electrode of the third transistor T3 is electrically connected to a reference voltage Vini, and a drain electrode of the third transistor T3 is electrically connected to the second node B. An end of the storage capacitor Cst is electrically connected to the first node A, another end of the storage capacitor Cst is electrically connected to the second node B. A second anode of a second light emitting unit D2 of the pixel unit 30A is electrically connected to the second node B, and a cathode of the second light emitting unit D2 is electrically connected to a ground end. A first anode of a first light emitting unit D1 of the pixel unit 30B is electrically connected to the second node B, cathode is electrically connected to the ground end. The pixel unit 30A and the pixel unit 30B are an $i^{th}$ one of the pixel units counted from left to right and an $i^{th}$ one of the pixel units counted from right to left respectively in the same row, and i is a positive integer.

The first transistor T1 is a driving transistor, the second transistor T2 is a switch transistor, and the third transistor T3 is a reset transistor. The power voltage Vdd is a constant high voltage, the reference voltage Vini is a constant low voltage.

A driving process of the pixel circuit 20 comprises a reset stage, a threshold voltage detection stage, a threshold voltage compensation stage, and a driving light emission stage. In the reset stage, a first scan signal voltage and a second scan signal voltage are high potentials, the second transistor T2 and the third transistor T3 switch on, a data signal voltage Vdata can be the same as the reference voltage Vini and are low potentials, the first transistor T1 switches off, the light emitting units D1, D2 do not emit light. In the threshold voltage detection stage, the first scan signal voltage is a high potential, second scan signal voltage is a low potential, the data signal voltage Vdata is a reference high potential Vref, second transistor T2 switches on, the third transistor T3 switches off, and the first transistor T1 switches on. In the threshold voltage compensation stage, the first scan signal voltage is a high potential, the second scan signal voltage is a low potential, the data signal voltage Vdata is a display data signal high potential Vdata, the second transistor T2 switches on, the third transistor T3 switches off, and the first transistor T1 switches on. In the driving light emission stage, both the first scan signal voltage and the second scan signal voltage are low potentials, the data signal voltage Vdata is a reference high potential Vref, the second transistor T2, the third transistor T3 switches off, the first transistor T1 switches on, and the light emitting units D1, D2 emit light.

With reference to FIGS. 5 to 13, the embodiment of the present invention also provides a method for manufacturing the above embodiment double-sided display panel, the manufacturing method comprises:

forming a plurality of pixel circuits 20 distributed in an array on the underlay 10; and forming a plurality of pixel units 30 distributed in an array on the underlay 10; wherein each of the pixel units 30 comprises a first light emitting unit 31 and a second light emitting unit 32, the first light emitting unit 31 of an $i^{th}$ one of the pixel units 30A counted from left to right in each row and the second light emitting unit 32 of an $i^{th}$ one of the pixel units 30B counted from right to left in the row are electrically connected to the same the pixel circuit 20, and i is a positive integer.

In an embodiment, with reference to FIG. 2, a second light shielding layer 60 can be formed on the underlay 10 in advance. Specifically, metal can be deposited on the underlay 10 by a physical vapor deposition process, and a pattern of the second light shielding layer 60 is formed by a lithography process. Hydrogen peroxide liquid can be used as an etchant. Material of the second light shielding layer 60 comprises at least one of molybdenum titanium alloy and copper.

Then, a buffer layer 71 is formed on the second light shielding layer 60 and the underlay 10 by a chemical vapor deposition process, and the buffer layer 71 covers the second light shielding layer 60.

Then, metal oxide is deposited on the buffer layer 71 by a physical vapor deposition process, and a pattern of the active layer 21 is formed by a lithography process. Oxalic acid drugs can be used as an etchant. The metal oxide can be but is not limited to indium gallium zinc oxide.

Then, an inorganic layer is deposited on the active layer 21 by a chemical vapor deposition process, and then a first metal layer is deposited on inorganic layer by a physical vapor deposition process, and patterns of the gate electrode 22 and the gate electrode insulation layer 72 are formed by the same lithography process. After the gate electrode 22 and the gate electrode insulation layer 72 are formed, the active layer 21 is conductorized.

Figure 6:
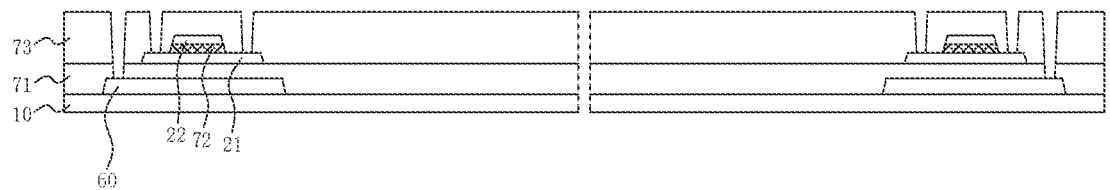

With reference to FIG. 6, an interlayer dielectric layer 73 is deposited on the gate electrode 22 by a chemical vapor deposition process, and the interlayer dielectric layer 73 and the buffer layer 71 are etched to form via holes of different depths in different locations. the via holes expose a partial surface of the second light shielding layer 60 or expose a partial surface of the active layer 21. Oxidizing gas can be used as a dry etchant.

Figure 7:
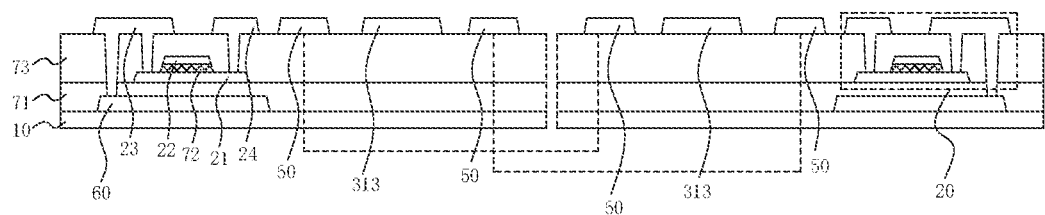

With reference to FIG. 7, a second metal layer is deposited on the interlayer dielectric layer 73 by a physical vapor deposition process, and patterns of a source electrode 23 and a drain electrode 24 are formed by a lithography process. Hydrogen peroxide liquid can be used as an etchant, material of the source electrode 23 and the drain electrode 24 comprises at least one material of molybdenum titanium and copper. The source electrode 23 and the drain electrode 24 are connected to the active layer through the via holes in the interlayer dielectric layer 73. One of the source electrode 23 and the drain electrode 24 is also connected to the second light shielding layer 60 through the via holes of the interlayer dielectric layer 73.

When the source electrode 23 and drain electrode 24 are formed on the second metal layer, a pattern of the first wires 50 is also formed on a corresponding location. Each of the first wires 50 is configured to connect with a column of second light emitting units and a column of first light emitting units.

In other embodiment, a pattern of the first wires 50 can also be formed on a corresponding location while the gate electrode 22 is formed on first metal layer.

In other embodiment, a pattern of the first wires 50 can also be formed on a corresponding location while the second light shielding layer 60 is formed on other metal layer.

A transparent metal layer is deposited on the interlayer dielectric layer 73 by a physical vapor deposition process, and a pattern of the first cathode 313 is formed by a lithography process. Material of the first cathode 313 comprises magnesium, silver, or magnesium silver alloy material, hydrogen peroxide liquid can be used as an etchant.

Figure 8:
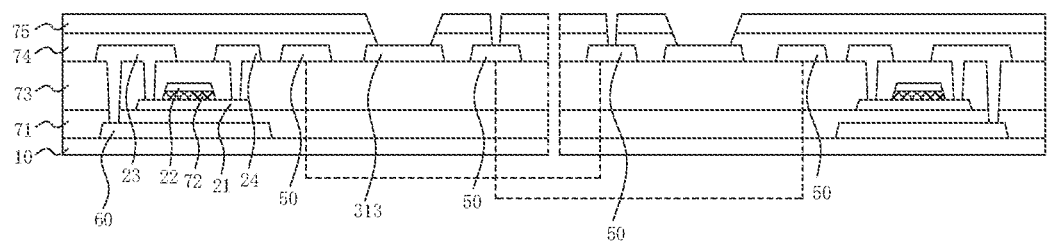

With reference to FIG. 8, a passivation layer 74 is deposited by a chemical vapor deposition process, an organic photoresist layer is coated on the passivation layer 74, and a passivation layer 74 and a first pixel definition layer 75 are formed by a lithography process. A recesses and via holes are defined in the first pixel definition layer 75, the recesses are defined through the first pixel definition layer 75 and the passivation layer 74 to expose a partial surface of the first cathode 313. The via hole extend through the first pixel definition layer 75 and the passivation layer 74 to expose a partial surface of the first wires 50. Oxidizing gas can be used as a dry etching agent. Material of the passivation layer 74 comprises at least one of $SiN_x$ and $SiO_x$.

Figure 9:
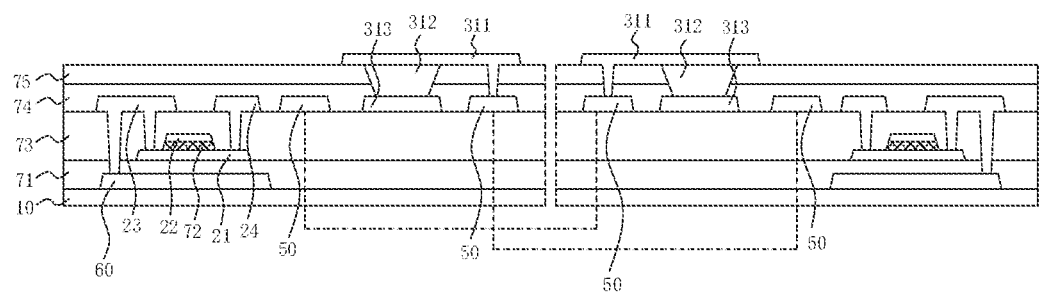

With reference to FIG. 9, a first light emitting layer 312 is formed in the recesses by an evaporation process or a jet-ink printing process. The first light emitting layer 312 comprises an electron injection layer, an electron transport layer, an organic light emitting material layer, a hole transport layer, and a hole injection layer.

A patterned first anode 311 is formed on the first light emitting layer 312, and the first anode 311 is an opaque conductive material. the first anode 311 can be a complex film layer, and can be a triple layer complex film layer of ITO/Ag/ITO or IZO/Ag/IZO. The first anode 311 is connected to the via hole and the first wire 50 above the passivation layer 74 through the first pixel definition layer 75.

Figure 10:
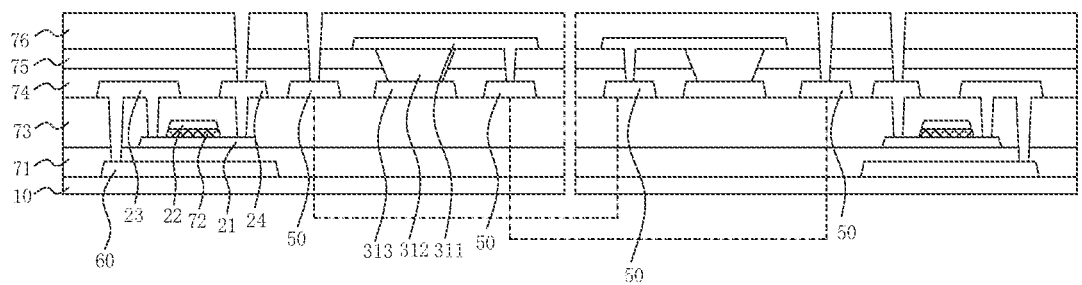

With reference to FIG. 10, an organic photoresist layer is coated on the first anode 311 and the organic photoresist layer is exposed, developed and baked to form a pattern of the planarization layer 76, and then the first pixel definition layer 75 and the passivation layer 74 are etched to form via holes. The via holes are defined through the planarization layer 76, the first pixel definition layer 75, and the passivation layer 74 to expose a partial surface of the drain electrode 24 or a partial surface of the first wires 50.

The planarization layer 76 can be opaque organic photoresist material to perform a light shielding effect, and can be also used as a first light shielding layer. When the planarization layer 76 has no light shielding effect, a black matrix can be formed between the planarization layer 76 and the first anode 311 to perform the light shielding effect.

Figure 11:
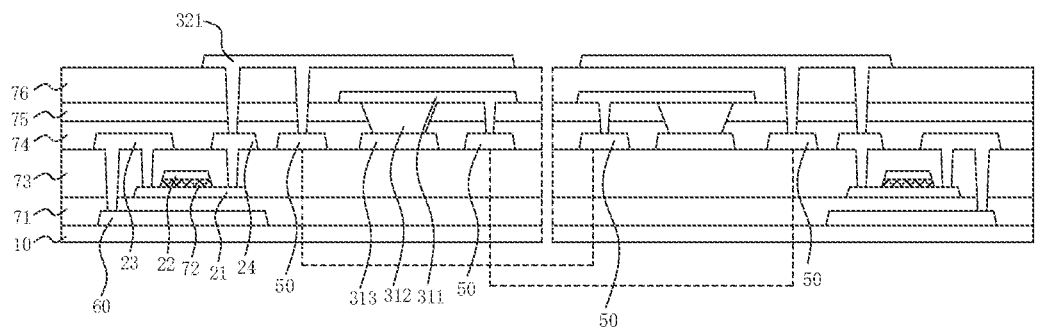

With reference to FIG. 11, a patterned second anode 321 is formed on the planarization layer 76, the second anode 321 is connected to the drain electrode 24 and first wire 50 through a via hole below to achieve a parallel connection between the second light emitting unit and the first light emitting unit in relative mirror locations.

The second anode 321 is an opaque conductive material. Specifically, the second anode 321 can be a complex film layer, and can be a triple layer complex film layer of ITO/Ag/ITO or IZO/Ag/IZO.

Figure 12:
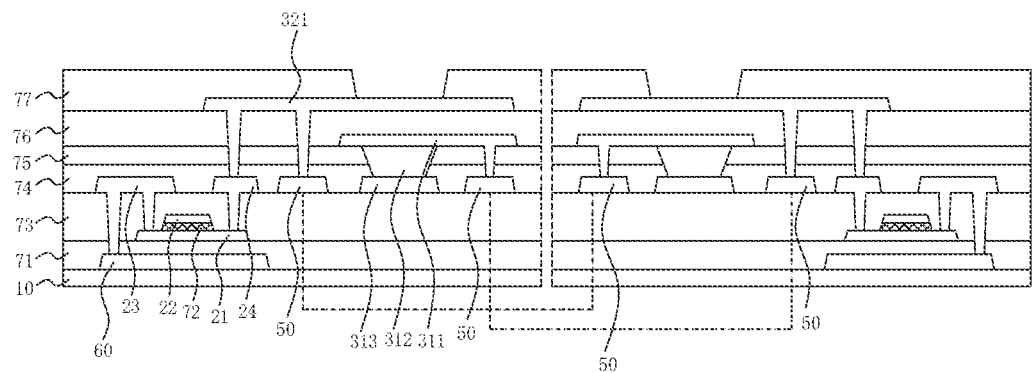

With reference to FIG. 12, a patterned second pixel definition layer 77 is formed on the second anode 321, and the second pixel definition layer 77 comprises a recesses, and the recesses exposes a partial surface of the second anode 321.

Figure 13:
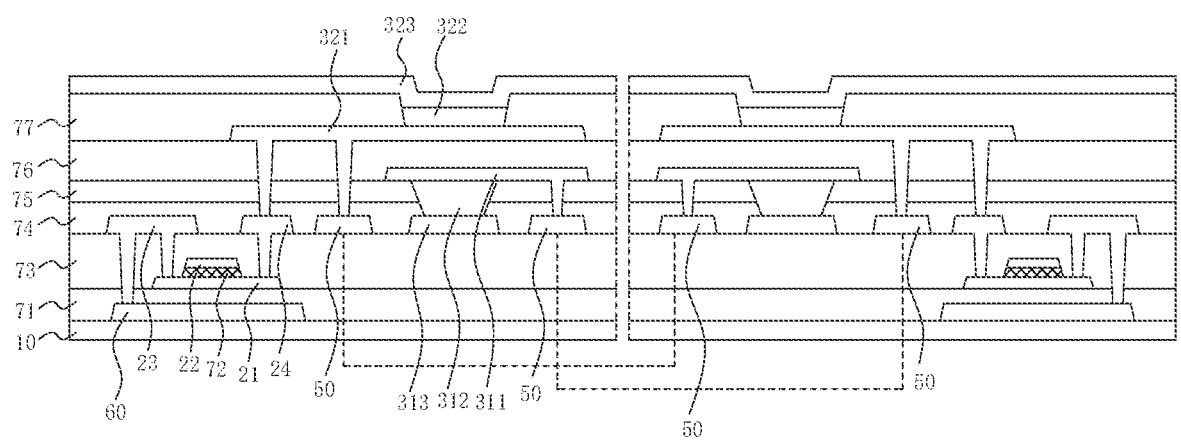

With reference to FIG. 13, a second light emitting layer 322 is formed in the recess of the second pixel definition layer 77 by a jet-ink printing process or an evaporation process. The second light emitting layer 322 comprises a hole injection layer, a hole transport layer, an organic light emitting layer, an electron transport layer, and an electron injection layer.

A second cathode 323 is evaporated on the second light emitting layer 322, the second cathode 323 can be evaporated on an entire surface of the second light emitting layer 322. Material of the second cathode 323 can be magnesium, silver, or magnesium silver alloy.

A manufacturing process of the double-sided display panel 100 as shown in FIG. 3 is similar to the descriptions of the above manufacturing method, descriptions of the above embodiment can be referred to and no repeated description here.

The embodiment of the present invention also provides a display device comprising a double-sided display panel 100 as described in any one of the embodiments, the display device comprises but is not limited to any one of display screens such as billboards, window display boards, labels, warning signs, etc.

Electrically connecting the first light emitting unit 31 and the second light emitting unit 32 in relative mirror locations to the same pixel circuit 20 and controlling the pixels in relative mirror locations to simultaneously emit light achieves the double-sided display panel having two sides displaying the same obverse images and improves a viewer's viewing experience.

It can be understood that for a person of ordinary skill in the art, equivalent replacements or changes can be made according to the technical solution of the present application and its inventive concept, and all these changes or replacements should belong to the scope of protection of the appended claims of the present application.

What is claimed is:

1. A double-sided display panel, comprising:
a plurality of data lines arranged along a first direction; and
a plurality of scan lines arranged along a second direction intersecting the first direction, wherein the scan lines intersect the data lines to define a plurality of pixel regions, a pixel unit is disposed in each of the pixel regions, and the pixel unit comprises a first light emitting unit and a second light emitting unit in opposite light emitting directions and a pixel circuit;
wherein the first direction is a row direction, the second direction is a column direction, and the first light emitting unit of an $i^{th}$ one of the pixel units counted from left to right in each row and the second light emitting unit of an $i^{th}$ one of the pixel units counted from right to left in the row are electrically connected to the pixel circuit of an $i^{th}$ one of the pixel units counted from right to left in the row, and i is a positive integer;
wherein each of the pixel circuits comprises a driving transistor and a switch transistor, gate electrodes of the switch transistors of the pixel circuits in the same row are electrically connected to one of the scan lines corresponding to the row, and source electrodes or drain electrodes of the switch transistors of the pixel circuits in the same column are electrically connected to one of the data lines corresponding to the column;
wherein first anodes of the first light emitting units of an $i^{th}$ one of the pixel units counted from left to right in each row and second anodes of the second light emitting units of an $i^{th}$ one of the pixel units counted from right to left in the row are electrically connected to source electrodes or drain electrodes of the driving transistors;
wherein the double-sided display panel comprises a plurality of first wires, the first anode and the second anode electrically connected to the same driving transistor are electrically connected through one of the first wires, and the first anode or the second anode is electrically connected to the source electrode or the drain electrode of a corresponding one of the driving transistors through a via hole;
wherein the second light emitting unit is disposed on a side of the first light emitting unit near or away from an underlay of the double-sided display panel;
wherein first cathodes of the first light emitting units and the source electrodes and the drain electrodes of the pixel circuits are disposed in the same layer;
wherein the double-sided display panel comprises:
a passivation layer disposed on the source electrodes, the drain electrodes, the first wires, and the first cathodes;
a first pixel definition layer disposed on the passivation layer;
a first anode disposed on the first pixel definition layer;
a planarization layer disposed on the first anode; and
the second anode disposed on the planarization layer;
wherein the first pixel definition layer has a plurality of first through holes defined through the first pixel definition layer, the passivation layer, the planarization layer has a plurality of second through holes defined through the planarization layer, the first pixel definition layer, and the passivation layer, in the first light emitting unit and the second light emitting unit electrically connected to the same pixel circuit, the first anode of the first light emitting unit is electrically connected to one of the first wires through a corresponding one of the first through holes, and the second anode of the second light emitting unit is electrically connected to the first wire through a corresponding one of the second through holes.

2. The double-sided display panel according to claim 1, wherein the first wires and the source electrodes and the drain electrodes in the pixel circuits are disposed in the same layer.

3. The double-sided display panel according to claim 1, wherein the second direction is the column direction, any one of the wires is electrically connected to the first light emitting units of an $i^{th}$ column counted from left to right and is electrically connected to the second light emitting units of an $i^{th}$ column counted from right to left.

4. The double-sided display panel according to claim 1, wherein in the pixel units, the first light emitting units and the second light emitting units are arranged alternately in at least one of the first direction and the second direction.

5. A double-sided display panel, comprising:
a plurality of data lines arranged along a first direction; and
a plurality of scan lines arranged along a second direction intersecting the first direction, wherein the scan lines intersect the data lines to define a plurality of pixel regions, a pixel unit is disposed in each of the pixel regions, and the pixel unit comprises a first light emitting unit and a second light emitting unit in opposite light emitting directions and a pixel circuit;
wherein the first direction is a row direction, and the first light emitting unit of an $i^{th}$ one of the pixel units counted from left to right in each row and the second light emitting unit of an $i^{th}$ one of the pixel units counted from right to left in the row are electrically connected to the pixel circuit of an $i^{th}$ one of the pixel units counted from right to left in the row, and i is a positive integer;
wherein each of the pixel circuits comprises a driving transistor, and first anodes of the first light emitting units of an $i^{th}$ one of the pixel units counted from left to right in each row and second anodes of the second light emitting units of an $i^{th}$ one of the pixel units counted from right to left in the row are electrically connected to a source electrode or a drain electrode of the driving transistor;
wherein the double-sided display panel comprises a plurality of first wires, the first anode and the second anode electrically connected to the same driving transistor are electrically connected through one of the first wires, and the first anode or the second anode is electrically connected to the source electrode or the drain electrode of a corresponding one of the driving transistors through a via hole;
wherein the second light emitting unit is disposed on a side of the first light emitting unit near or away from an underlay of the double-sided display panel;

wherein first cathodes of the first light emitting units and the source electrodes and the drain electrodes of the pixel circuits are disposed in the same layer;

wherein the double-sided display panel comprises:
- a passivation layer disposed on the source electrodes, the drain electrodes, the first wires, and the first cathodes;
- a first pixel definition layer disposed on the passivation layer;
- a first anode disposed on the first pixel definition layer;
- a planarization layer disposed on the first anode; and
- the second anode disposed on the planarization layer;
  wherein the first pixel definition layer has a plurality of first through holes defined through the first pixel definition layer, the passivation layer, the planarization layer has a plurality of second through holes defined through the planarization layer, the first pixel definition layer, and the passivation layer, in the first light emitting unit and the second light emitting unit electrically connected to the same pixel circuit, the first anode of the first light emitting unit is electrically connected to one of the first wires through a corresponding one of the first through holes, and the second anode of the second light emitting unit is electrically connected to the first wire through a corresponding one of the second through holes.

6. The double-sided display panel according to claim 5, wherein the first wires and the source electrodes and the drain electrodes in the pixel circuits are disposed in the same layer.

7. The double-sided display panel according to claim 5, wherein the second direction is the column direction, any one of the wires is electrically connected to the first light emitting units of an $i^{th}$ column counted from left to right and is electrically connected to the second light emitting units of an $i^{th}$ column counted from right to left.

8. The double-sided display panel according to claim 5, wherein in the pixel units, the first light emitting units and the second light emitting units are arranged alternately in at least one of the first direction and the second direction.

9. The double-sided display panel according to claim 5, wherein in a thickness direction of the double-sided display panel, the second light emitting unit and the first light emitting unit of each of the pixel units have an overlapping surface.

10. The double-sided display panel according to claim 5, wherein a first light shielding layer is disposed between the second light emitting unit and the first light emitting unit.

11. A display device, comprising a double-sided display panel, wherein the double-sided display panel comprises:
- a plurality of data lines arranged along a first direction; and
- a plurality of scan lines arranged along a second direction intersecting the first direction, wherein the scan lines intersect the data lines to define a plurality of pixel regions, a pixel unit is disposed in each of the pixel regions, and the pixel unit comprises a first light emitting unit and a second light emitting unit in opposite light emitting directions and a pixel circuit;

wherein the first direction is a row direction, and the first light emitting unit of an $i^{th}$ one of the pixel units counted from left to right in each row and the second light emitting unit of an $i^{th}$ one of the pixel units counted from right to left in the row are electrically connected to the pixel circuit of an $i^{th}$ one of the pixel units counted from right to left in the row, and i is a positive integer;

wherein the double-sided display panel comprises a plurality of first wires, the first anode and the second anode electrically connected to the same driving transistor are electrically connected through one of the first wires, and the first anode or the second anode is electrically connected to the source electrode or the drain electrode of a corresponding one of the driving transistors through a via hole;

wherein the second light emitting unit is disposed on a side of the first light emitting unit near or away from an underlay of the double-sided display panel;

wherein first cathodes of the first light emitting units and the source electrodes and the drain electrodes of the pixel circuits are disposed in the same layer;

wherein the double-sided display panel comprises:
- a passivation layer disposed on the source electrodes, the drain electrodes, the first wires, and the first cathodes;
- a first pixel definition layer disposed on the passivation layer;
- a first anode disposed on the first pixel definition layer;
- a planarization layer disposed on the first anode; and
- the second anode disposed on the planarization layer;
  wherein the first pixel definition layer has a plurality of first through holes defined through the first pixel definition layer, the passivation layer, the planarization layer has a plurality of second through holes defined through the planarization layer, the first pixel definition layer, and the passivation layer, in the first light emitting unit and the second light emitting unit electrically connected to the same pixel circuit, the first anode of the first light emitting unit is electrically connected to one of the first wires through a corresponding one of the first through holes, and the second anode of the second light emitting unit is electrically connected to the first wire through a corresponding one of the second through holes.

12. The double-sided display panel according to claim 11, wherein the first wires and the source electrodes and the drain electrodes in the pixel circuits are disposed in the same layer.

13. The double-sided display panel according to claim 11, wherein the second direction is the column direction, any one of the wires is electrically connected to the first light emitting units of an $i^{th}$ column counted from left to right and is electrically connected to the second light emitting units of an $i^{th}$ column counted from right to left.

14. The double-sided display panel according to claim 11, wherein in the pixel units, the first light emitting units and the second light emitting units are arranged alternately in at least one of the first direction and the second direction.

* * * * *